(12) United States Patent  (10) Patent No.: US 8,888,255 B2
Mardilovich et al.  (45) Date of Patent: Nov. 18, 2014

(54) PIEZOELECTRIC ACTUATOR WITH COPLANAR ELECTRODES

(75) Inventors: Peter Mardilovich, Corvallis, OR (US); Haggai Karlinski, Ramat Chen (IL); Kurt Ulmer, Vancouver, WA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 13/695,794

(22) PCT Filed: Jun. 29, 2010

(86) PCT No.: PCT/US2010/040466
§ 371 (c)(1),
(2), (4) Date: Nov. 2, 2012

(87) PCT Pub. No.: WO2012/002942
PCT Pub. Date: Jan. 5, 2012

(65) Prior Publication Data
US 2013/0050351 A1    Feb. 28, 2013

(51) Int. Cl.
*B41J 2/045* (2006.01)
*H01L 41/09* (2006.01)
*B41J 2/14* (2006.01)
*H01L 41/047* (2006.01)

(52) U.S. Cl.
CPC ........... *H01L 41/094* (2013.01); *B41J 2/14282* (2013.01); *H01L 41/047* (2013.01); *H01L 41/0973* (2013.01)
USPC ................. 347/70; 347/68; 347/71; 347/72

(58) Field of Classification Search
CPC ............... B41J 2/14282; B41J 2/14233; B41J 2/14209; H01L 41/094; H01L 41/0966; H01L 41/047
USPC ............... 347/68–72; 310/365, 366, 330, 332
See application file for complete search history.

(56) References Cited

U.S. PATENT DOCUMENTS

| | | | |
|---|---|---|---|
| 6,243,114 B1 * | 6/2001 | Yano et al. | 347/68 |
| 6,352,337 B1 | 3/2002 | Sharma | |
| 6,394,363 B1 | 5/2002 | Arnott et al. | |
| 7,053,532 B2 | 5/2006 | Lean et al. | |
| 7,290,336 B2 * | 11/2007 | Buhler et al. | 29/890.1 |
| 2002/0085066 A1 | 7/2002 | Asano | |
| 2003/0137563 A1 | 7/2003 | Zhang | |
| 2006/0087536 A1 | 4/2006 | Sugahara | |
| 2008/0211880 A1 | 9/2008 | Hara et al. | |
| 2009/0015903 A1 | 1/2009 | Bang et al. | |
| 2009/0051740 A1 | 2/2009 | Hiroshima | |

FOREIGN PATENT DOCUMENTS

| | | |
|---|---|---|
| JP | 1991-104647 | 5/1991 |
| JP | 1991-175047 | 7/1991 |
| JP | 1998-022509 | 1/1998 |
| JP | 2008-000960 | 1/2008 |

* cited by examiner

*Primary Examiner* — Henok Legesse

(57) ABSTRACT

A piezoelectric actuator includes a cantilever membrane. A thin film sheet is affixed to one side of the cantilever membrane to bend the membrane in multiple directions in response to an electric field induced within the thin film sheet. A plurality of coplanar electrodes disposed on the thin film sheet are interdigitated in relation to one another to generate the electric field during application of a voltage across interdigitated electrodes.

20 Claims, 11 Drawing Sheets

PIEZOELECTRIC ACTUATOR WITH COPLANAR ELECTRODES

BACKGROUND

An inkjet printing device is an example of a fluid ejection device that provides drop-on-demand ejection of fluid droplets. A piezoelectric inkjet printer, for example, uses a fluid ejection assembly with a piezoelectric material actuator to force fluid droplets out of a nozzle toward a print medium, such as a sheet of paper, to print an image onto the print medium. More specifically, a piezoelectric material actuator includes a flexible piezoelectric material sheet that deforms in response to an applied electric field, generating pressure pulses inside a fluid-filled chamber to eject one or more fluid droplets. Because piezoelectric actuators use pressure (not heat) to force fluid droplets out of nozzles, piezo fluid ejection assemblies can accommodate a wide selection of jetable materials. Accordingly, piezoelectric printheads are utilized widely to print on a variety of media substrates.

BRIEF DESCRIPTION OF THE DRAWINGS

The present embodiments will now be described, by way of example, with reference to the accompanying drawings, in which.

DETAILED DESCRIPTION

Overview

Figure 1:
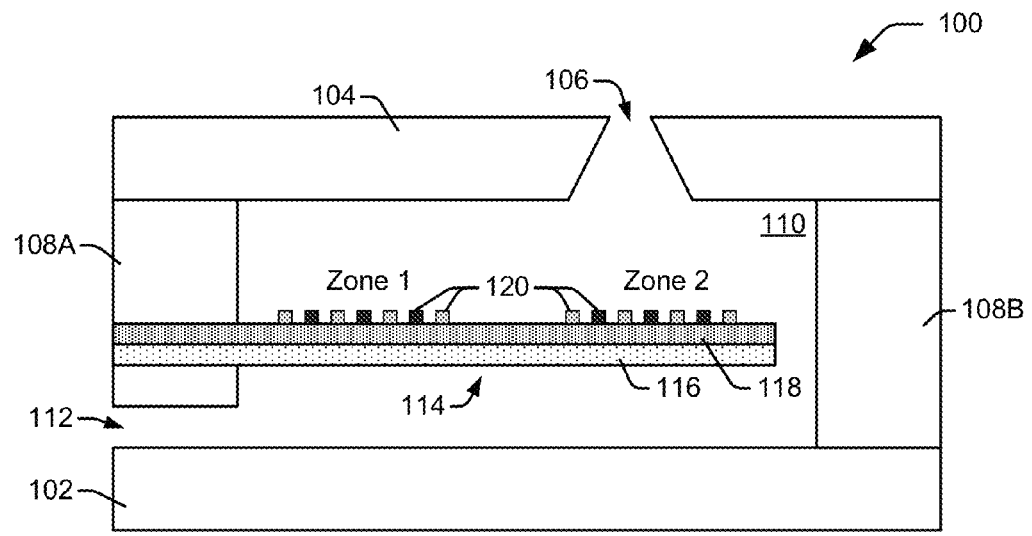
FIG. 1 shows a cross-sectional side view of a piezoelectric fluid ejection assembly 100, according to an embodiment.

As noted above, piezoelectric fluid ejection assemblies eject fluid droplets through the application of an electric field in a flexible piezoelectric material sheet. In conventional piezoelectric fluid ejection assemblies, the piezoelectric sheet is adhered to the underside of a moveable membrane or diaphragm whose top side generally defines the bottom of a fluid chamber. The electric field is induced in the piezoelectric sheet by applying a voltage potential across electrodes in the sheet. The electric field causes physical deformation in the sheet and a resultant flexing of the moveable membrane into the area of the fluid-filled chamber. Encroachment of the moveable membrane into the chamber area generates a pressure pulse within the fluid-filled chamber which ejects fluid droplets through a nozzle.

A disadvantage associated with conventional piezoelectric fluid ejection assemblies is the high cost of fabrication. Electrodes are generally connected to the top and bottom surfaces of the piezoelectric material sheet, and the application of a voltage across the electrodes causes physical deformation of the sheet. The location of the electrode connections and repeated sheet-deformation events present challenges with respect to maintaining strong electrode connections at the top and bottom surfaces of the sheet. Accordingly, fabrication costs are higher in order to help maintain these electrode connections in a robust manner.

One method of reducing the fabrication cost is to arrange the electrodes on the same surface of the piezoelectric material sheet in an interdigitated manner. Having both electrodes on the same surface enables easier electrical connections. This arrangement eliminates the need for electrical vias, and thus reduces the overall number of etching steps during fabrication. An additional benefit to having the interdigitated electrodes on only one side of a piezoceramic thin film sheet is that it provides for a wider range of seed materials to be used that align the crystalline structure during growth of the thin film.

A drawback to this approach, however, has been that the interdigitated electrode configuration results in a smaller physical response in the piezoelectric material sheet for the same voltage applied across electrodes on opposing top and bottom surfaces of the sheet. The desired fluid ejection characteristics (e.g., drop weight, drop velocity) have been difficult to achieve using comparable voltages across the interdigitated electrodes because of the smaller electric field induced in the piezoelectric material sheet. Accordingly, the reduced mechanical response has discouraged the use of such interdigitated electrodes in piezoelectric fluid ejection assemblies.

Embodiments of the present disclosure address this challenge, generally through the use of a piezoelectrically actuated cantilever or beam having multiple sets of coplanar interdigitated electrodes to create bending of the cantilever or beam in multiple directions, and through the use of multiple of such cantilevers or beams per fluid chamber in a fluid ejection assembly. The ability to bend the actuator cantilever/beam in multiple directions allows for minimizing the stresses in the actuator. In addition, the ability to independently control multiple actuator cantilevers/beams within the fluid chamber enables a greater ability and flexibility in controlling fluid ejection characteristics, such as pressure distribution within the chamber, the shape of the meniscus, the drop velocity, the drop weight and the drop shape.

In one embodiment, a piezoelectric actuator includes a cantilever membrane with a thin film sheet affixed to one side of the membrane. The thin film sheet is configured to bend the membrane in multiple directions in response to an electric field induced within the thin film sheet. The actuator also includes a plurality of coplanar electrodes embedded within the thin film sheet. The electrodes are interdigitated in relation to one another to generate the electric field by application of a voltage across alternating interdigitated electrodes.

In another embodiment, a piezoelectric fluid ejection assembly includes a fluid chamber having a bottom, a top, and sidewalls. A nozzle plate defines the top of the chamber and includes a nozzle outlet. A cantilever membrane is supported by a sidewall of the chamber and includes an adhered piezoceramic thin film sheet to bend the membrane in multiple directions to cause ejection of fluid droplets through the nozzle outlet in response to an electric field induced within the sheet. The electric field is induced by application of a voltage across interdigitated fingers of coplanar electrodes embedded with the thin film sheet.

In still another embodiment, a fluid ejection device includes an electronic controller to control fluid ejection from a fluid ejection assembly. The fluid ejection assembly includes a fluid chamber defined by a top nozzle plate having a nozzle outlet, a bottom floor having a fluid inlet, and sidewalls separating the top nozzle plate from the bottom floor. The assembly also includes a cantilever actuator supported at one end by a sidewall of the fluid chamber. The cantilever actuator has a piezoelectric thin film sheet to bend the cantilever actuator in multiple directions upon inducement of an electric field through the piezoelectric thin film sheet. The electric field is induced by application of a voltage across coplanar, interdigitated electrodes disposed on the piezoelectric thin film sheet.

Illustrative Embodiments

FIG. 1 shows a cross-sectional side view of a piezoelectric fluid ejection assembly 100, according to an embodiment of the disclosure. The assembly includes a rigid floor 102 and a rigid top nozzle plate 104 having a nozzle outlet 106 through which fluid droplets are ejected. The assembly also includes a number of sidewalls 108A and 108B, collectively referred to as sidewalls 108. The sidewalls 108 separate the floor 102 from the nozzle plate 104. The rigid floor 102, the nozzle plate 104, and the sidewalls 108 define a fluid chamber 110 to contain fluid prior to ejection of droplets of the fluid through the nozzle outlet 106. Sidewall 108A has a fluid inlet 112 to receive the fluid that eventually gets ejected as droplets through nozzle outlet 106. The placement of fluid inlet 112 is not limited to sidewall 108A. In different embodiments, for example, fluid inlet 112 may be placed in other sidewalls 108 or in the floor 102, or it may be multiple fluid inlets placed in various sidewalls 108 or in the floor 102.

The piezoelectric fluid ejection assembly 100 also includes a flexible piezoelectric cantilever actuator 114. Actuator 114 includes a cantilever membrane 116 supported at one end by a sidewall 108A of fluid chamber 110. Adhered to one side of the cantilever membrane 116 is a piezoceramic thin film sheet 118 (e.g., PZT—lead zirconate titanate). Disposed on thin film sheet 118 are a plurality of electrodes 120. Electrodes 120 are all on the same side of sheet 118 and they share the same plane with one another (i.e., the electrodes are coplanar). In some embodiments, electrodes 120 are embedded within thin film sheet 118. The electrodes 120 are generally shown as multiple sets of interdigitated electrodes associated with different zones (e.g., zones 1 and 2) to facilitate poling of the piezoceramic thin film sheet 118 and bending of the actuator 114 in multiple directions, as discussed in greater detail below.

Figure 2:
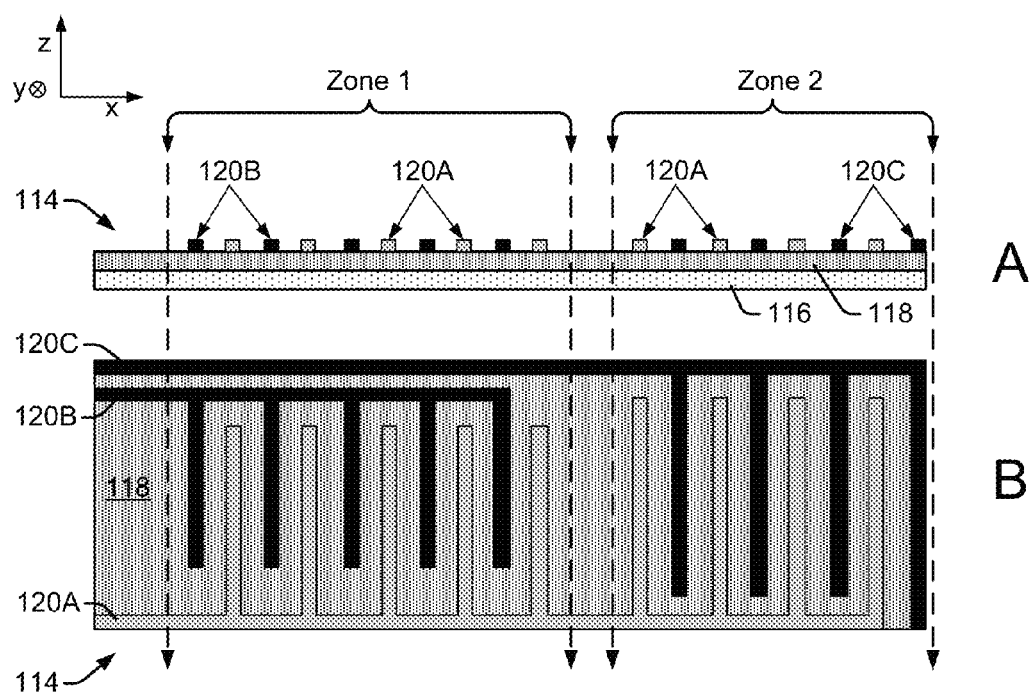
FIG. 2 shows a side view and top down view of a flexible piezoelectric cantilever actuator, according to an embodiment.

FIG. 2 shows a side view "A" and top down view "B" of a flexible piezoelectric cantilever actuator, such as actuator 114 of FIG. 1, according to an embodiment of the disclosure. An xyz axis is shown in FIG. 2 in conjunction with the side view "A" of the piezoelectric cantilever actuator 114. The x-axis runs from left to right and is parallel to the length of the actuator 114, while the y-axis runs into the plane of FIG. 1, parallel to the width of the actuator 114. The z-axis is parallel to the height of the actuator 114, running from bottom to top in FIG. 2.

One example layout of the coplanar electrodes 120 is shown in FIG. 2, where the electrodes 120 are represented as a plurality of electrodes 120A, 120B and 120C. The plurality of coplanar electrodes includes a first, common electrode 120A that is interdigitated with respect to second 120B and third 120C electrodes. Each coplanar electrode 120 has a portion that is disposed parallel to a side of the thin film sheet 118 and includes electrode fingers protruding perpendicularly away from the side of the sheet 118 toward the opposite side of the sheet 118. The electrode fingers of each electrode 120 are interleaved with electrode fingers of an opposing coplanar electrode disposed on an opposite side of the thin film sheet 118. More specifically, in the embodiment of FIG. 2 the electrode fingers of common electrode 120A are interleaved in Zone 1 with the electrode fingers of electrode 120B, and they are interleaved in Zone 2 with the electrode fingers of electrode 120C.

Electrode 120A is common to both opposing electrodes 120B and 120C. Common electrode 120A is used alternately with electrodes 120B and 120C in a two step poling process during the manufacture of the piezoceramic thin film sheet 118. Such poling processes are generally well-known and involve orienting randomly oriented dipoles in the raw piezoelectric material into more parallel orientations through the application of heat and a strong electric field between electrodes. In the embodiment of FIG. 2, Zone 1 of the piezoelectric sheet 118 is poled in a first step using electrodes 120A and 120B, and Zone 2 of the piezoelectric sheet 118 is poled in a second step, with reversed polarity, using electrodes 120A and 120C. Thereafter, during actuation, the piezoelectric actuator 114 can be controlled through the application of voltage across electrodes 120A, 120B and 120C to bend in multiple directions. More specifically, the electric field between the fingers of the interdigitated electrodes 120 can be controlled to create expansion or contraction of the piezoelectric sheet 118 between the electrode fingers, resulting in a desired bending direction of the actuator 114. For example, in one embodiment an electric field induced within the actuator 114 causes contraction along the x-axis and z-axis, and expansion along the y-axis.

Figure 3A:
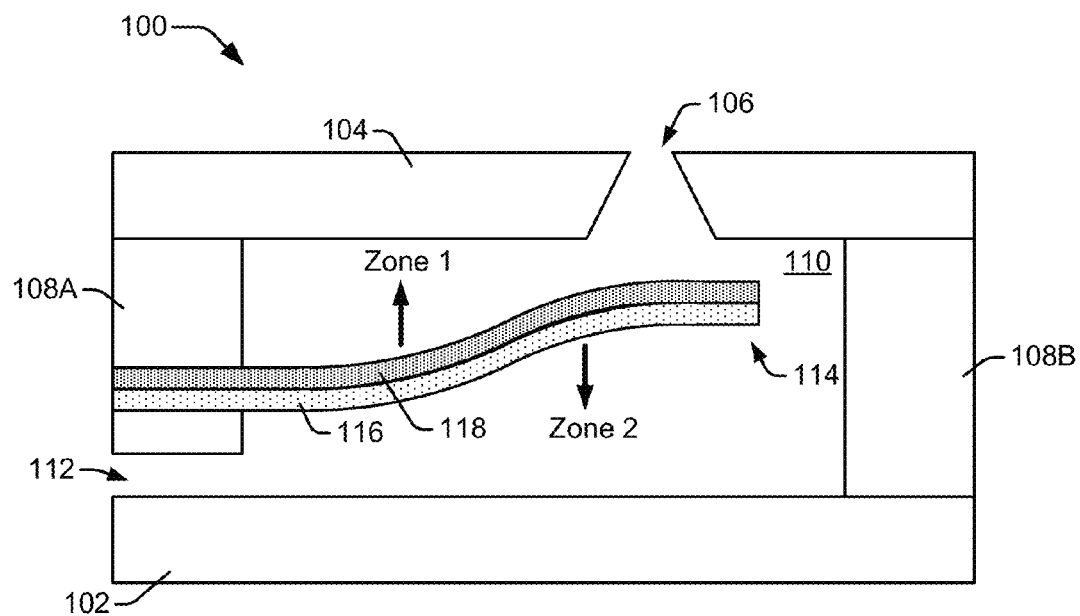
FIG. 3 shows examples of multiple bending in a piezoelectric cantilever actuator, according to embodiments.
Figure 3B:
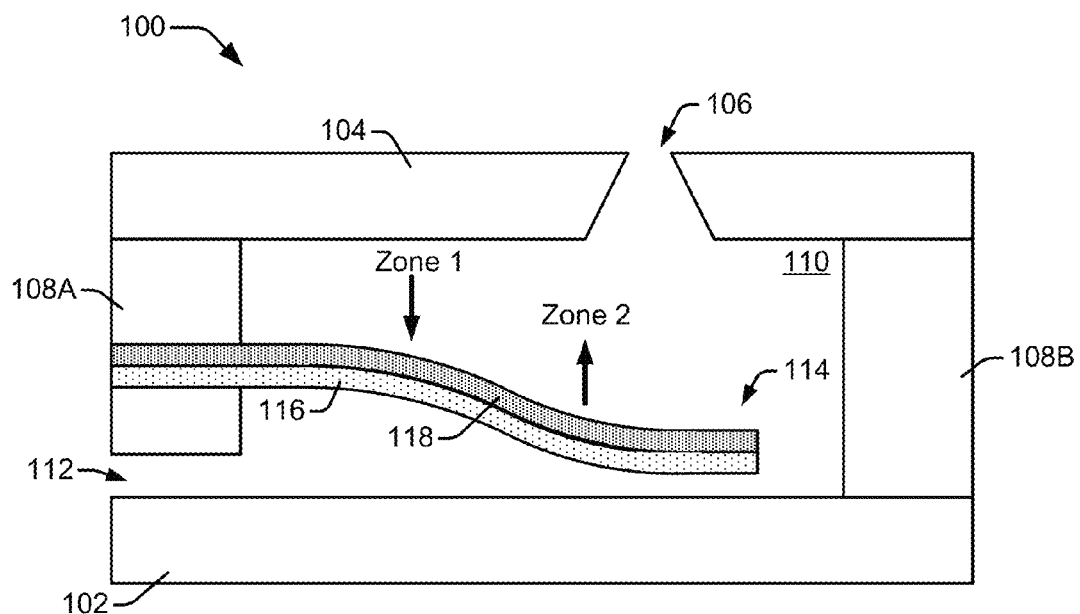

FIGS. 3A and 3B show examples of multiple bending in a piezoelectric cantilever actuator 114, according to embodiments of the disclosure. The amount of bending shown in the actuator 114 of FIGS. 3A and 3B is exaggerated for the purpose of illustrating the effect of multiple bending caused by electric fields induced in the piezoelectric sheet 118 through voltage applied across electrodes 120A, 120B and 120C. In the embodiment of FIG. 3A, the Zone 1 area of the actuator 114 is controlled to provide an upward bend in the actuator 114 as indicated by the arrow pointing upward, while the Zone 2 area is controlled to provide a downward bend in the actuator 114 as indicated by the arrow pointing downward. Although only two bending zones are illustrated in the figures and discussed throughout this disclosure, it is noted that additional bending zones are contemplated.

In FIG. 3A, it is presumed that the original position of the actuator 114 was flat, or straight, as shown for example in FIG. 1. Thus, FIG. 3A illustrates an example of the actuator 114 bending in two directions during actuation (upward in Zone 1, and downward in Zone 2). Upon actuation (i.e., application of voltage across electrodes 120A, 120B and 120C to induce electric field), the bending actuator 114 creates pressure pulses that force fluid droplets from the chamber 110 and out through the nozzle outlet 106. The gaps 500 (see FIG. 5) around the edges of the cantilever actuator 114 (i.e., between the sidewalls 108 and the actuator) serve as refill pathways within the chamber 110 to refill the fluid in the chamber 110 through the inlet 112. As the actuator 114 returns to its original position (i.e., flat, as in FIG. 1), fluid flows through the gaps around the actuator to refill the fluid ejected by the actuator.

In FIG. 3B, another example of multiple bending is shown, wherein the original position of the actuator 114 is a bent position. That is, prior to ejecting fluid from chamber 110, the actuator 114 is bent in a pre-ejection position in preparation for ejecting fluid. In the example shown, the Zone 1 area of the actuator 114 is controlled to provide a downward bend in the actuator 114 as indicated by the arrow pointing downward, while the Zone 2 area is controlled to provide an upward bend in the actuator 114 as indicated by the arrow pointing upward. Such a starting position for the actuator 114 can preload the actuator and increase the overall fluid displacement during a jetting event, such as where the actuator 114 progresses from an original starting position as shown in FIG. 3B to a position as shown in FIG. 3A.

Figure 4:
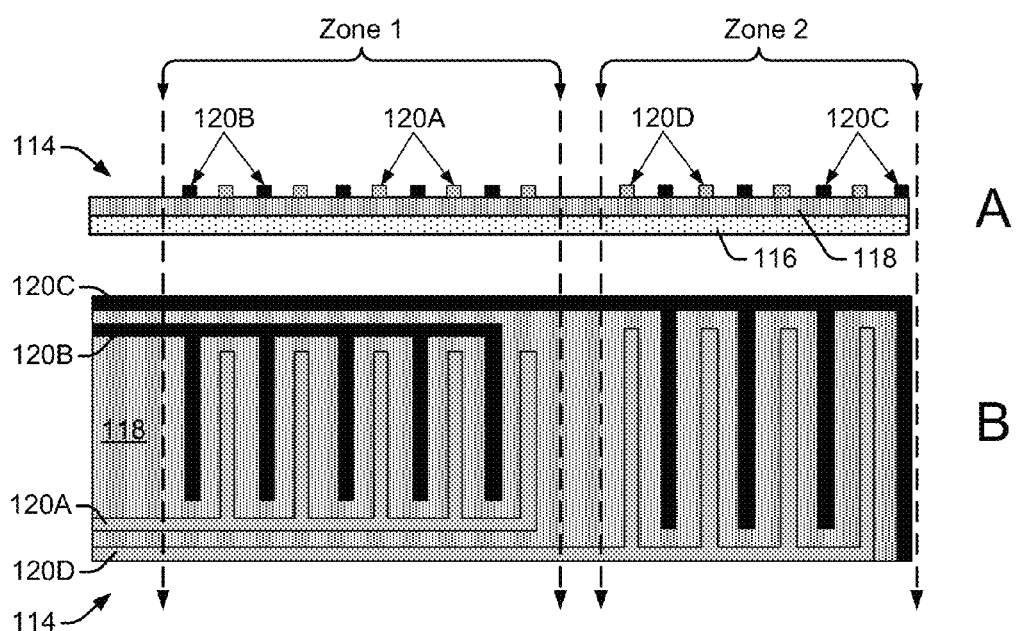
FIG. 4 shows a side view and top down view of a flexible piezoelectric cantilever actuator, according to an embodiment.

FIG. 4 shows a side view "A" and top down view "B" of a flexible piezoelectric cantilever actuator, such as actuator 114 of FIG. 1, according to an embodiment of the disclosure. In the example layout of coplanar electrodes 120 in FIG. 4, the electrodes 120 are a plurality of electrodes 120A, 120B, 120C and 120D that make up multiple electrode pairs disposed on the piezoelectric thin film sheet 118. Each coplanar electrode 120 has a portion that is disposed parallel to a side of the thin film sheet 118 and includes electrode fingers protruding perpendicularly away from the side of the sheet 118 toward the opposite side of the sheet 118. Each electrode pair has a first electrode and a second electrode disposed on opposite sides of the thin film sheet 118. Specifically, in the FIG. 4 embodiment, electrodes 120A and 120B form an electrode pair associated with Zone 1, and they are disposed opposite one another on thin film sheet 118 with their electrode fingers interleaved. Likewise, electrodes 120C and 120D form an electrode pair associated with Zone 2, and they are disposed opposite one another on thin film sheet 118 with their electrode fingers interleaved. Although only two electrode pairs are shown, additional electrode pairs are possible. Each of the electrodes 120 in the FIG. 4 embodiment is independent and can be independently controlled. Therefore, during fabrication the poling process can be performed in a single step to pole Zone 1 and Zone 2 differently (e.g., in reverse polarity), using electrode pair 120A and 120B for Zone 1, and using electrode pair 120C and 120D for Zone 2. In addition, during actuation, the application of voltage across electrode pairs in the different Zones can be independently controlled to create bending of the actuator 114 in multiple and varying directions.

FIG. 5 (FIGS. 5A-5F) shows top down views of piezoelectric fluid ejection assemblies 100 with varying cantilever actuator configurations, according to embodiments of the disclosure. In the top down view, the nozzle plate 104 is not shown in order to better illustrate the various cantilever actuator configurations within the chamber 110. In addition, the gaps 500 mentioned previously between the actuators 114 and sidewalls 108 of the chamber 110 (and the gaps 500 between multiple actuators), are more readily apparent in FIG. 5. The gaps 500 act as refill pathways to refill the chamber with fluid. As the actuator 114 returns to its original position after actuation, fluid flows through the gaps around the actuator to refill the fluid ejected by the actuator.

One potential limitation of using a cantilever actuator in a piezoelectric fluid ejection assembly 100 is that the stiffness of the actuator may not be great enough to enable the actuator to return back to its original shape after actuation. That is, when the electric field is applied to expand or contract the piezoelectric sheet 118 and cause the actuator 114 to bend, the stiffness of the actuator membrane 116 may not be great enough to snap the actuator 114 back into its original shape once the electric field is removed or reversed. Accordingly, the embodiments shown in FIG. 5 provide examples of how the stiffness of the cantilever actuator 114 can be tuned to overcome this potential limitation. More specifically, the stiffness of the cantilever actuator 114 can be tuned during fabrication by adjusting the aspect ratio (i.e., length to width ratio) of the actuator. In conjunction with tuning the stiffness of the cantilever actuators, multiple actuators can also be employed within a fluid ejection assembly 100 as the aspect ratio of the cantilever actuator is reduced. Furthermore, the configuration of cantilever actuators 114 can be adjusted to tune the uniformity and rate of fluid refill into the chamber 110 through gaps 500 after fluid ejection.

Figure 5A:
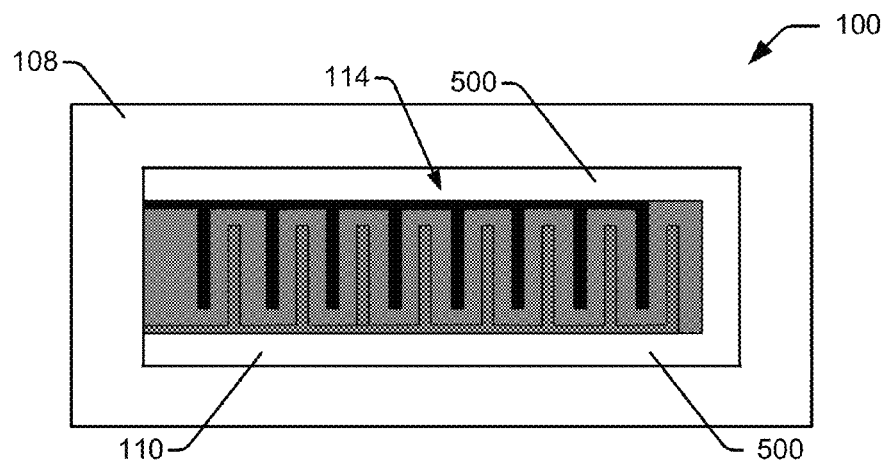
FIG. 5 shows top down views of a piezoelectric fluid ejection assemblies with varying cantilever actuator configurations, according to embodiments.
Figure 5B:
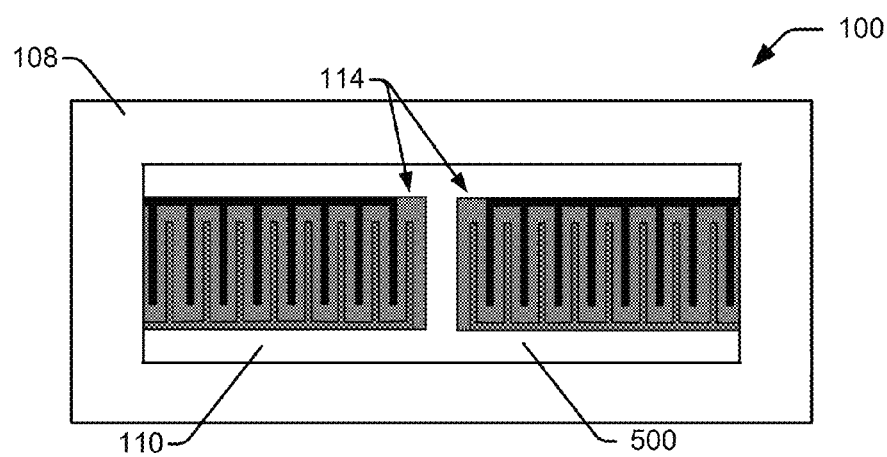
Figure 5C:
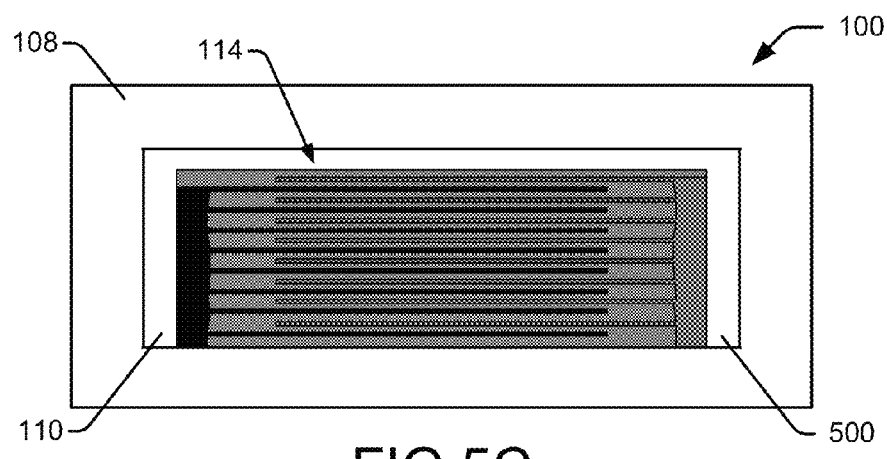
Figure 5D:
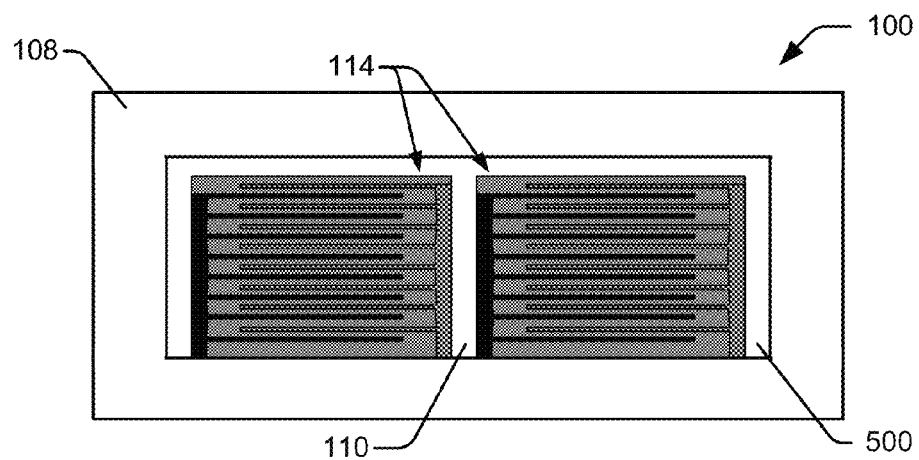
Figure 5E:
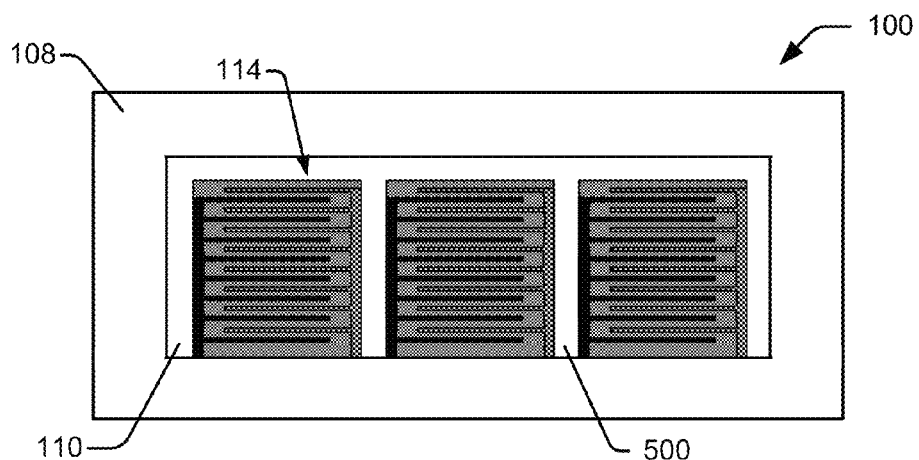
Figure 5F:
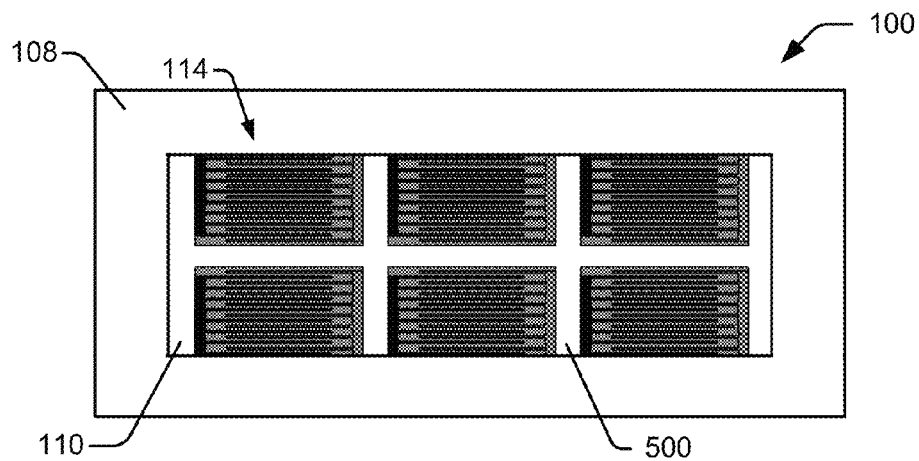

For example, beginning with FIG. 5A, the fluid ejection assembly 100 includes a single cantilever actuator 114 connected at a sidewall 108 and extending into chamber 110 along the long dimension of the chamber. It is apparent that the aspect ratio of the actuator 114 in FIG. 5A is higher than the aspect ratios of actuators in FIGS. 5B-5E, because the actuator's length is significantly greater than its width. Thus, the stiffness of the actuator 114 in FIG. 5A is lower and there exists a greater possibility that the actuator may not return back to its original shape after actuation. By comparison, the fluid ejection assembly 100 of FIG. 5B includes two cantilever actuators 114 connected at opposite sidewalls 108 and extending into chamber 110 along the long dimension of the chamber. The actuators in FIG. 5B are approximately half the length as the actuator in FIG. 5A, while having the same width. Therefore, the aspect ratio is significantly lower and the actuators in FIG. 5B are more stiff and better able to return to their original shapes after actuation. In another configuration, FIG. 5C illustrates a fluid ejection assembly 100 having an actuator 114 whose width is connected to, and extends along, the long dimension of the chamber 110, and whose length extends into the shorter dimension of the chamber 110. Therefore, the aspect ratio (i.e., length to width ratio) is significantly reduced, and the actuator 114 has a high stiffness. FIGS. 5D, 5E and 5F, illustrate additional examples of fluid ejection assemblies 100 having actuators 114 with differently tuned aspect ratios and different configurations with respect to the number of actuators, the sidewall attachment locations of the actuators, and actuators opposing one another within the fluid ejection assembly 100. As those skilled in the art will recognize, still further example configurations are possible and contemplated herein.

Figure 6:
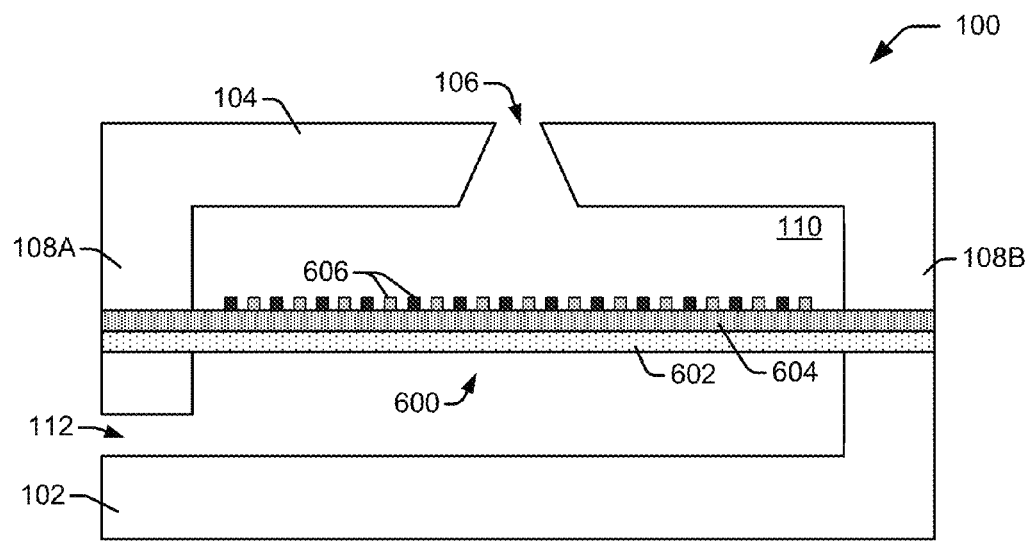
FIG. 6 shows a cross-sectional side view of a piezoelectric fluid ejection assembly, according to an embodiment.

Another way to increase the stiffness of the actuator is to use a beam configuration, where the actuator is fixed or connected at both ends to opposing sidewalls of the chamber in the fluid ejection assembly. In this regard, FIG. 6 shows a cross-sectional side view of a piezoelectric fluid ejection assembly 100, according to an embodiment of the disclosure. The assembly 100 is configured substantially the same as the assembly 100 described with respect to FIG. 1. However, in the embodiment of FIG. 6, assembly 100 includes a flexible piezoelectric beam actuator 600 fixed at both ends to opposing side walls 108 of the assembly 100.

The piezoelectric beam actuator 600 includes a beam membrane 602 supported at both ends by opposing sidewalls 108A and 108B of fluid chamber 110. Adhered to one side of the beam membrane 602 is a piezoceramic thin film sheet 604 (e.g., PZT—Lead zirconate titanate). The thin film sheet 604 includes a plurality of coplanar, interdigitated electrodes 606 disposed on the sheet and configured in substantially the same manner as electrodes 120 discussed above with respect to the cantilever actuator 114. As such, a number of Zones (not shown) across the actuator 600 may be configured to provide bending in multiple directions through the application of voltage across coplanar, interdigitated electrodes within those zones.

Figure 7A:
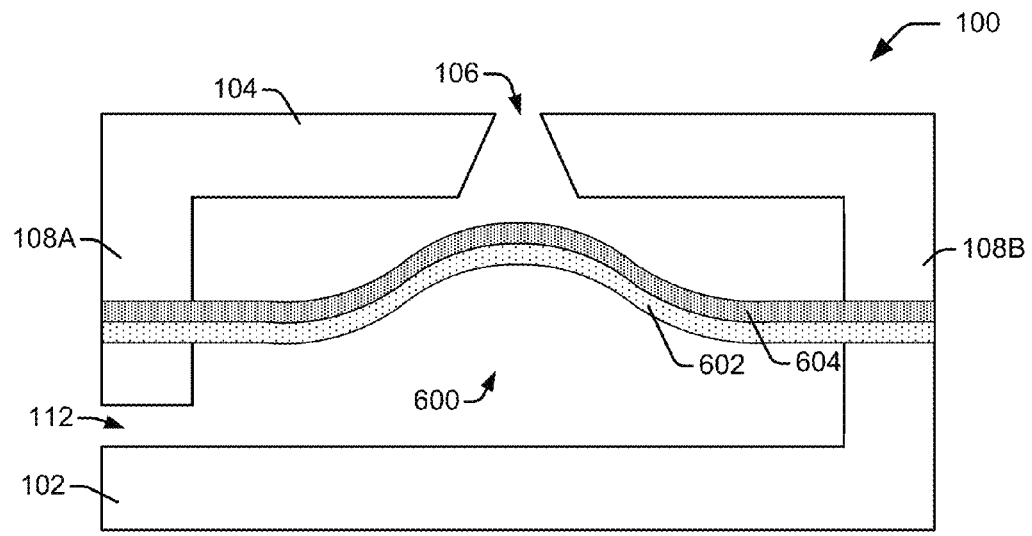
FIG. 7 shows examples of multiple bending in a piezoelectric beam actuator, according to embodiments.
Figure 7B:
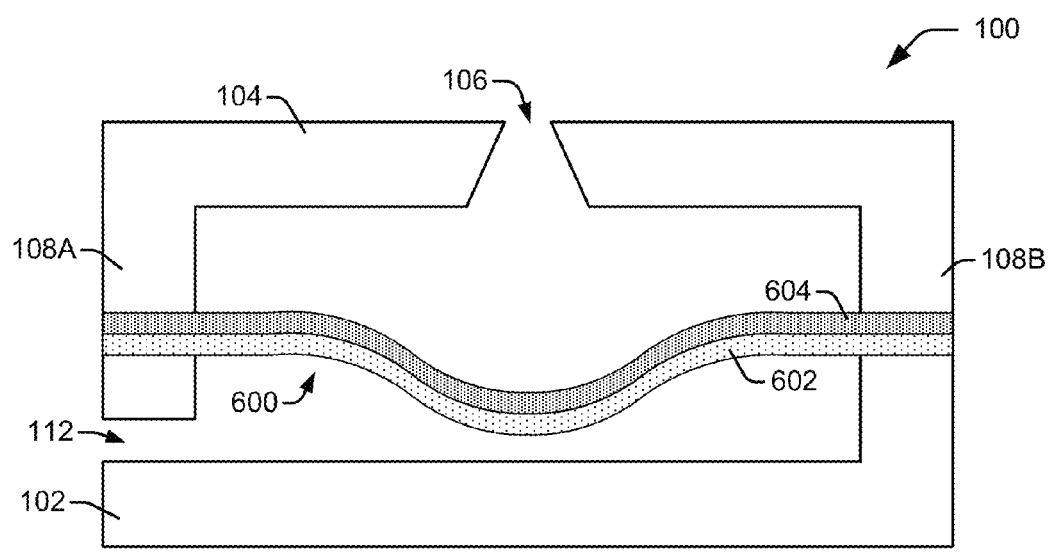

FIG. 7 (FIGS. 7A and 7B) shows an example of multiple bending in a piezoelectric beam actuator 600, according to an embodiment of the disclosure. The amount of bending shown in the actuators 600 of FIGS. 7A and 7B is exaggerated for the purpose of illustrating the effect of multiple bending caused by electric fields induced in the piezoelectric sheet 604 through voltage applied across electrodes 606. In the embodiments of FIG. 7, different Zones (not shown) of the beam actuator 600 are controlled to provide bending of the beam in multiple directions (e.g., upward and downward). The movement of the beam actuator 600 creates pressure pulses which force fluid droplets out of the chamber 110 through nozzle outlet 106. As shown in FIG. 8, gaps 500 on either side of the beam actuator 600 between the actuator 600 and the chamber sidewalls 108 110 (and the gaps 500 between multiple beam actuators 600) serve as refill pathways within the chamber 110 to refill the fluid in the chamber through the inlet 112. After actuation, as the beam actuator 600 returns to its original position, fluid flows through the gaps around the actuator to refill the fluid ejected by the actuator.

In a manner similar to that discussed above with regard to the cantilever actuator 114, FIG. 7B shows an example of multiple bending in a piezoelectric beam actuator 600 where the original position of the beam actuator 600 is a bent position, rather than a straight position as shown in FIG. 6. Thus, prior to ejecting fluid from chamber 110, the beam actuator 600 is bent in a pre-ejection position in preparation for ejecting fluid. Such a starting position for the beam actuator 600 can preload the actuator and increase the overall fluid displacement during a jetting event, such as where the actuator 600 progresses from an original starting position as shown in FIG. 7B to a position as shown in FIG. 7A.

FIG. 8 (FIGS. 8A-D) shows top down views of piezoelectric fluid ejection assemblies 100 with varying beam actuator configurations, according to embodiments of the disclosure. In the top down view, the nozzle plate 104 is not shown in order to better illustrate the various beam actuator 600 configurations within the chamber 110. As with the cantilever actuator 114, the aspect ratio of the beam actuator 600 can be tuned to control the actuator stiffness. As the aspect ratio of the beam actuator 600 is changed, various configurations of beam actuators 600 within a piezoelectric fluid ejection assembly 100 are possible. Furthermore, the configuration of beam actuators 600 can be adjusted to tune the uniformity and rate of fluid refill into the chamber 110 through gaps 500 after fluid ejection.

Figure 8A:
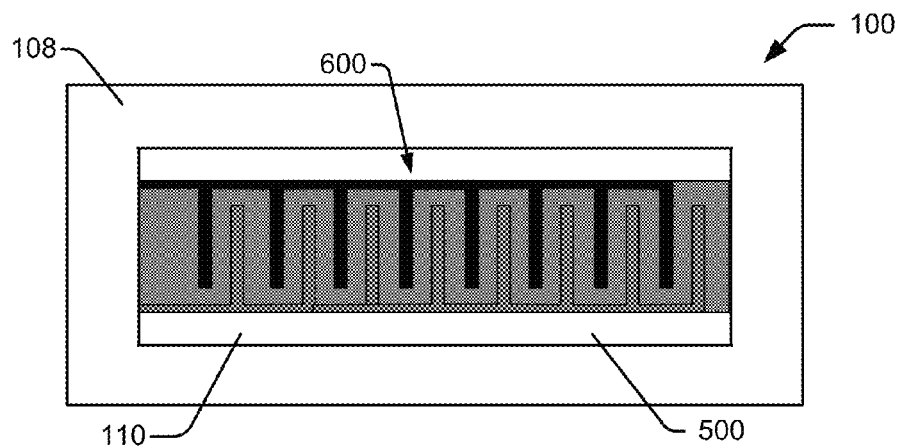
FIG. 8 shows top down views of piezoelectric fluid ejection assemblies with varying beam actuator configurations, according to embodiments.
Figure 8B:
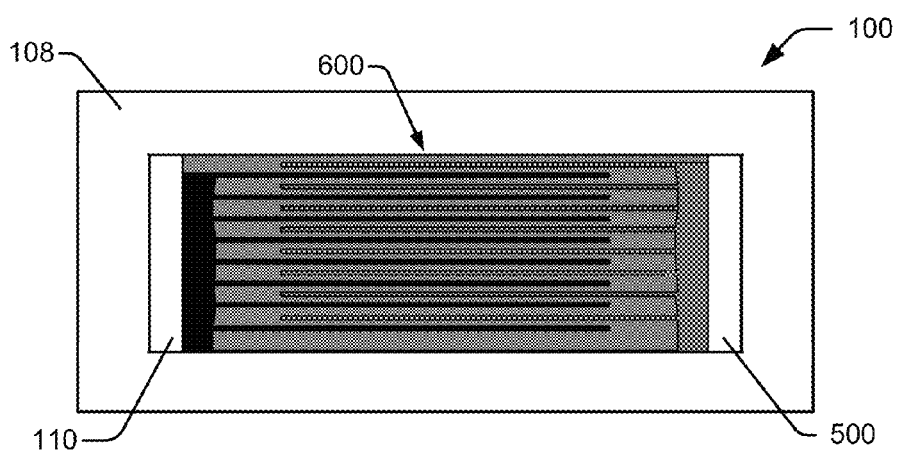
Figure 8C:
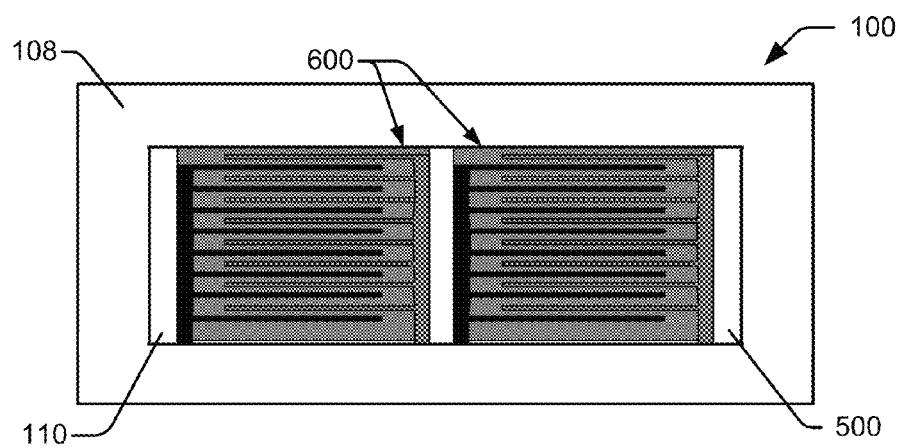
Figure 8D:
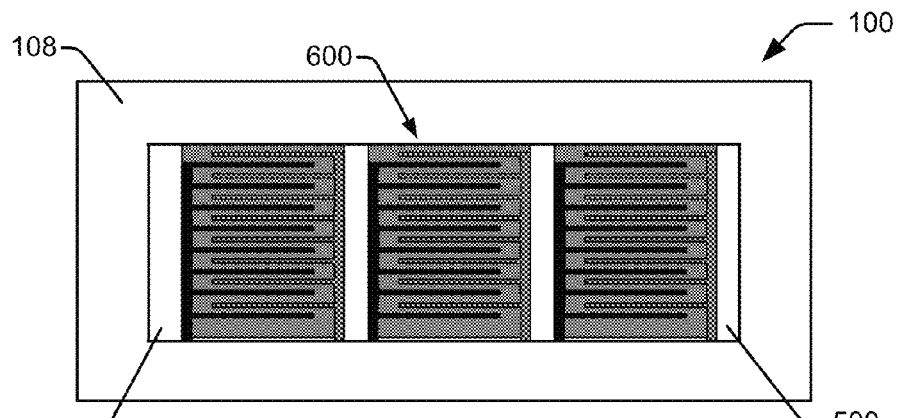

In FIG. 8A the fluid ejection assembly 100 includes a single beam actuator 600 extended across the entire long dimension of the chamber 110 and connected at both ends to opposing sidewalls 108. The stiffness of the beam actuator 600 in FIG. 8A is lower than in the actuators of FIGS. 8B-8D, because the aspect ratio (i.e., length to width ratio) of the actuator 600 in FIG. 8A is higher than the actuators in FIGS. 8B-8D. In FIG. 8B, for example, the beam actuator 600 is connected lengthwise across the shorter dimension of the chamber 110 to opposing sidewalls 108, and the width of the beam actuator 600 extends mostly along the long dimension of the chamber 110. Thus, the actuator in FIG. 8B has a lower aspect ratio and higher stiffness. FIGS. 8C and 8D illustrate additional example configurations of beam actuators 600 with different aspect ratios. As illustrated, an increasing number of beam actuators 600 disposed in a parallel manner within the chamber 110 is possible as the aspect ratio of the beams decreases.

Figure 9:
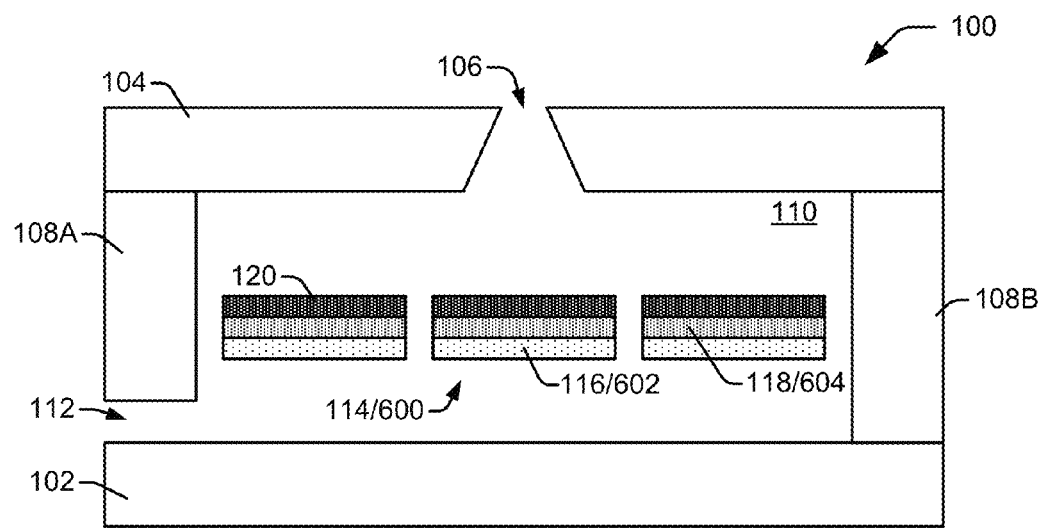
FIG. 9 shows a cross-sectional side view of a piezoelectric fluid ejection assembly having multiple actuators, according to an embodiment.

FIG. 9 shows a cross-sectional side view of a piezoelectric fluid ejection assembly 100 having multiple actuators, according to an embodiment of the disclosure. The actuators can be cantilever actuators 114 or beam actuators 600. The FIG. 9 view of assembly 100 is oriented perpendicular relative to the view of the similar assembly shown in FIG. 1. Thus, the lengths of the actuators run into the page away from the viewer and out of the page toward the viewer, and the locations where the actuators connect to the chamber sidewalls 108 cannot be seen. The actuators are generally configured as previously described, with a membrane 116/602 having a piezoceramic thin film sheet 118/604 adhered to one side, and coplanar interdigitated electrodes disposed on the thin film sheet 118/604.

Figure 10:
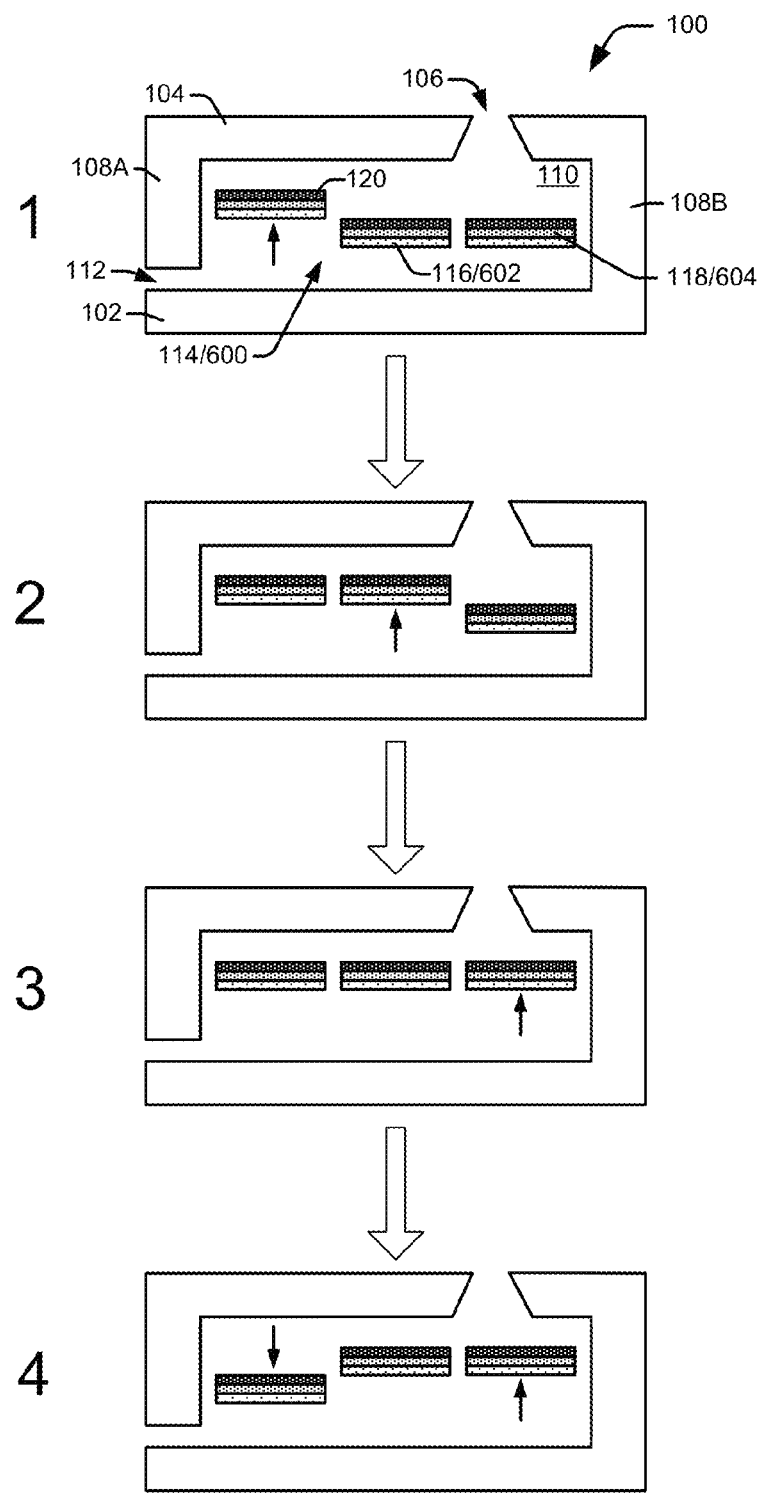
FIG. 10 illustrates an example of controlling multiple actuators in a fluid ejection assembly, according to an embodiment.

FIG. 10 illustrates an example of controlling multiple actuators in a fluid ejection assembly 100, according to an embodiment of the disclosure. The ability to independently manipulate multiple actuators in the fluid chamber 110 enables control over various fluid characteristics such as the pressure distribution, fluid drop velocity, fluid drop shape, fluid drop weight, and the shape of the meniscus at the nozzle outlet 106. The location of the nozzle outlet 106 can also be varied to facilitate desired fluid characteristics in conjunction with the actuator configuration in the chamber 110. As shown in FIG. 10, there are three actuators that can each be controlled independently. The actuators can be controlled to bend or actuate in a certain sequence, for example. In the sequence shown in FIG. 10, at step 1 the actuator farthest from the nozzle outlet is activated first, as indicated by the upward arrow. Next, at step 2, the actuator next closest to the nozzle outlet is activated. Then at step 3, the actuator closest to the nozzle outlet is activated. Activating the actuators in this manner can manipulate the fluid pressure in the chamber 110 such that fluid pressure increases from left to right toward the nozzle outlet to concentrate energy more efficiently and achieve greater pressure through the nozzle outlet. At step 4, the actuator farthest from the nozzle outlet is then relaxed and returned to its original shape. Such actuator control can manipulate the fluid waveform in the chamber in a push-pull manner which can help control, for example, the shape of the ejected fluid droplet (e.g., the drop tail) and the fluid meniscus.

Although one example sequence of controlling multiple actuators has been described, it should be clear that many other methods of controlling multiple actuators in a fluid ejection assembly 100 are possible. For example, more than one actuator can be activated or deactivated (i.e., relaxed) at one time, or all actuators can be activated or deactivated at one time.

Figure 11:
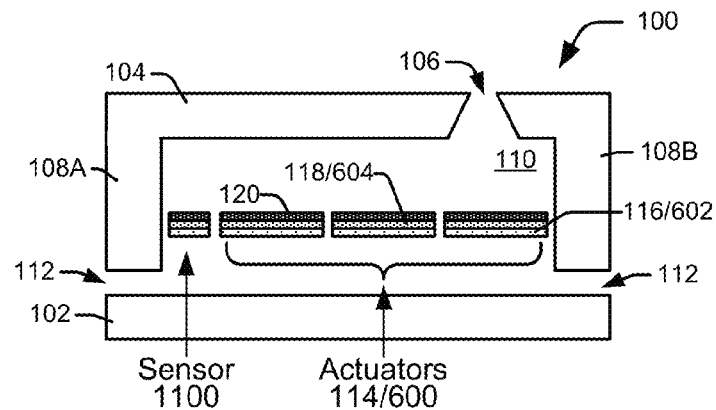
FIG. 11 shows a cross-sectional side view of a piezoelectric fluid ejection assembly having multiple actuators and a sensor, according to an embodiment.

FIG. 11 shows a cross-sectional side view of a piezoelectric fluid ejection assembly 100 having multiple actuators and a sensor 1100, according to an embodiment of the disclosure. The actuators and sensor 1100 can be cantilevers or beams. The sensor 1100 is generally configured as previously described regarding the cantilever and beam actuators, with a membrane having a piezoceramic thin film sheet adhered to one side, and coplanar interdigitated electrodes disposed on the thin film sheet. The sensor 1100 provides feedback about general fluid conditions in the chamber 110, such as fluid movement and changing pressure, and the timing of such conditions with respect to actuation of one or more actuators in the chamber 110. Changing fluid conditions cause bending in the sensor which causes current flow through the electrodes. The amount and timing of current flowing through the sensor electrodes provides information about the amount and timing of the bending of the sensor which in turn provides information about the fluid conditions.

Figure 12:
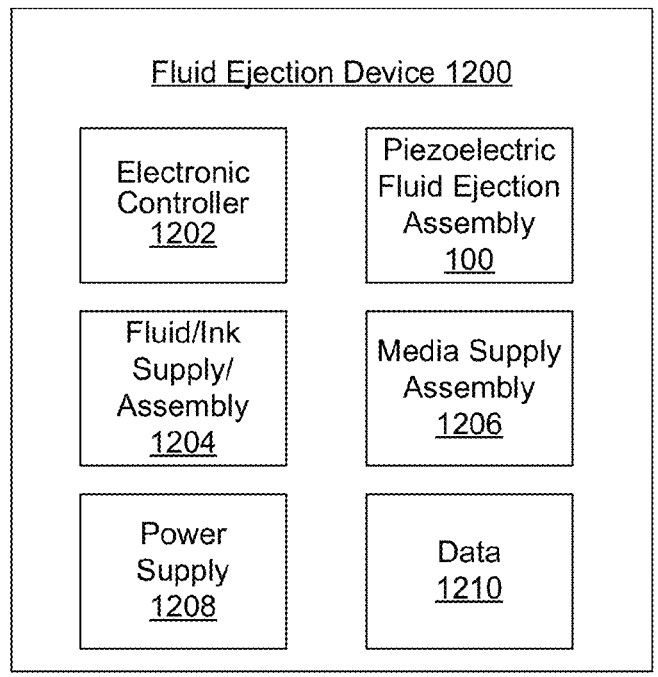
FIG. 12 shows a block diagram of a basic fluid ejection device, according to an embodiment.

FIG. 12 shows a block diagram of a basic fluid ejection device, according to an embodiment of the disclosure. The fluid ejection device 1200 includes an electronic controller 1202 and a piezoelectric fluid ejection assembly 100. Electronic controller 1202 typically includes a processor, firmware, and other electronics for communicating with and controlling assembly 100 to eject fluid droplets in a precise manner.

In one embodiment, fluid ejection device 1200 may be an inkjet printing device. As such, fluid ejection device 1200 may also include a fluid/ink supply and assembly 1204 to supply fluid to fluid ejection assembly 100, a media transport assembly 1206 to provide media for receiving patterns of ejected fluid droplets, and a power supply 1208. In general, electronic controller 1202 receives data from a host system, such as a computer. The data represents, for example, a document and/or file to be printed and forms a print job that includes one or more print job commands and/or command parameters. From the data, electronic controller 1202 defines a pattern of drops to eject which form characters, symbols, and/or other graphics or images.

What is claimed is:

1. A piezoelectric actuator comprising:
   a cantilever membrane;
   a thin film sheet affixed to one side of the membrane to bend different portions of the membrane in different directions in response to an electric field induced within the thin film sheet during an actuation of the actuator; and
   a plurality of coplanar electrodes disposed on one side of the thin film sheet, oriented parallel with each other, and interdigitated in relation to one another to generate the electric field via application of a voltage across alternating interdigitated electrodes during the actuation,
   the plurality of coplanar electrodes comprising multiple sets of electrodes associated with different zones of the actuator each independently controllable to contemporaneously bend the different portions of the membrane in the different directions during the actuation.

2. The piezoelectric actuator of claim 1, wherein the plurality of coplanar electrodes comprises first and second electrodes interdigitated in relation to a third common electrode, the first and third electrodes forming a first set of electrodes associated with a first zone of the actuator, and the second and third electrodes forming a second set of electrodes associated with a second zone of the actuator.

3. The piezoelectric actuator of claim 1, wherein the plurality of coplanar electrodes comprises multiple pairs of electrodes, each pair having first and second electrodes opposite one another and interdigitated in relation to one another, a first pair of first and second electrodes forming a first set of electrodes associated with a first zone of the actuator, and a second pair of first and second electrodes forming a second set of electrodes associated with a second zone of the actuator.

4. The piezoelectric actuator of claim 1, wherein each coplanar electrode is disposed parallel to a side of the thin film sheet and includes fingers protruding perpendicularly away from the side toward an opposite side, the fingers interleaved with fingers of an opposing coplanar electrode disposed parallel to the opposite side.

5. The piezoelectric actuator of claim 1, wherein the thin film sheet is a piezoceramic thin film sheet.

6. The piezoelectric actuator of claim 5, wherein the piezoceramic thin film sheet has first and second zones poled in reverse polarity with respect to one another.

7. The piezoelectric actuator of claim 1, wherein a second zone of the actuator is poled in reverse polarity to a first zone of the actuator.

8. The piezoelectric actuator of claim 1, wherein a first zone of the actuator is independently controllable to bend a first portion of the membrane in a first direction while a second zone of the actuator is independently controllable to bend a second portion of the membrane in a second direction opposite the first direction.

9. A piezoelectric fluid ejection assembly, comprising:
   a fluid chamber having a bottom, a top, and sidewalls;
   a nozzle plate defining the top of the chamber and having a nozzle outlet;
   a cantilever membrane supported by a sidewall of the chamber and having an adhered piezoceramic thin film sheet to, during an actuation, bend adjacent portions of the membrane in opposite directions in response to an electric field induced within the thin film sheet by application of a voltage across interdigitated fingers of coplanar electrodes disposed on one side of the thin film sheet and oriented parallel with each other, the coplanar electrodes forming multiple sets of electrodes associated with different zones each subject to independent control to contemporaneously bend the adjacent portions of the membrane in the opposite directions during the actuation, the bending of the adjacent portions of the membrane in the opposite directions to cause ejection of a fluid droplet through the nozzle outlet.

10. The piezoelectric fluid ejection assembly of claim 9, comprising multiple parallel cantilever membranes, each membrane subject to independent actuation to manipulate fluid pressure within the fluid chamber.

11. The piezoelectric fluid ejection assembly of claim 9, comprising multiple cantilever membranes, each membrane supported by either one of two opposing sidewalls of the fluid chamber and each membrane subject to independent actuation to manipulate fluid pressure within the fluid chamber.

12. The piezoelectric fluid ejection assembly of claim 9, wherein the membrane has an original, pre-ejection position that includes multiple bends.

13. The piezoelectric fluid ejection assembly of claim 9, wherein the membrane comprises a beam membrane supported at two ends by opposing sidewalls of the fluid chamber.

14. The piezoelectric fluid ejection assembly of claim 9, wherein the membrane comprises multiple beam membranes parallel to one another, each membrane subject to independent actuation to manipulate fluid pressure within the fluid chamber.

15. The piezoelectric fluid ejection assembly of claim 9, comprising gaps on either side of the membrane to permit fluid to flow around the membrane from an inlet at the bottom toward the nozzle outlet at the top.

16. The piezoelectric fluid ejection assembly of claim 9, comprising multiple cantilever membranes, wherein one of the membranes is a sensor membrane, the piezoceramic thin film sheet of the sensor membrane to generate an electric field in response to bending of the sensor membrane caused by changing fluid conditions within the fluid chamber.

17. A fluid ejection device comprising:
   an electronic controller to control fluid ejection from a fluid ejection assembly; and
   the fluid ejection assembly comprising:

a fluid chamber defined by a top nozzle plate having a nozzle outlet, a bottom floor having a fluid inlet, and sidewalls separating the top nozzle plate from the bottom floor;

a cantilever actuator supported at one end by a sidewall of the fluid chamber, the cantilever actuator having a piezoelectric thin film sheet to contemporaneously bend the cantilever actuator in at least two different directions upon inducement of an electric field through the piezoelectric thin film sheet by application of voltage across coplanar electrodes disposed in an interdigitated manner on one side of the piezoelectric thin film sheet and oriented parallel with each other, the coplanar electrodes comprising multiple sets of electrodes associated with different zones of the cantilever actuator each to be independently controlled to contemporaneously bend the cantilever actuator in the at least two different directions, including at least a first direction and a second direction opposite the first direction.

18. The fluid ejection device of claim 17, wherein the coplanar electrodes comprise first and second electrodes interdigitated in relation to a third common electrode, the first and third electrodes forming a first set of electrodes associated with a first zone of the cantilever actuator, and the second and third electrodes forming a second set of electrodes associated with a second zone of the cantilever actuator.

19. The fluid ejection device of claim 17, wherein the coplanar electrodes comprise a first pair of first and second interdigitated electrodes forming a first set of electrodes associated with a first zone of the cantilever actuator, and a second pair of first and second interdigitated electrodes forming a second set of electrodes associated with a second zone of the cantilever actuator.

20. The fluid ejection device of claim 17, wherein a second zone of the cantilever actuator is provided at an unsupported end of the cantilever actuator and independently controlled relative to a first zone of the cantilever actuator.

* * * * *